United States Patent
Hong et al.

(10) Patent No.: US 6,236,593 B1
(45) Date of Patent: May 22, 2001

(54) METHOD FOR SIMULTANEOUSLY PROGRAMMING PLURAL FLASH MEMORIES HAVING INVALID BLOCKS

(75) Inventors: Sung-In Hong, Suwon; Young-Jun Choi, Kyunggi-do, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/558,561

(22) Filed: Apr. 26, 2000

(30) Foreign Application Priority Data

Apr. 27, 1999 (KR) .................................................. 99-15073

(51) Int. Cl.$^7$ .................................................. G11C 16/04
(52) U.S. Cl. ...................................... 365/185.11; 711/103
(58) Field of Search ........................ 365/185.11, 230.03; 711/103

(56) References Cited

U.S. PATENT DOCUMENTS

| | | | |
|---|---|---|---|
| 4,783,737 | 11/1988 | Ara et al. | 200/364 |
| 5,404,485 | 4/1995 | Ban | 425/395 |
| 5,479,638 | * 12/1995 | Assar et al. | 711/103 |
| 6,000,006 | * 12/1999 | Bruce et al. | 711/103 |
| 6,131,139 | * 10/2000 | Kikuchi et al. | 711/103 |

* cited by examiner

*Primary Examiner*—Richard Elms
*Assistant Examiner*—Vanthu Nguyen
(74) *Attorney, Agent, or Firm*—Marger Johnson & McCollom, P.C.

(57) ABSTRACT

Disclosed is a method for programming flash memories, each of which has a memory cell array divided into plural blocks. Each of the blocks is associated with block status information indicating whether it is valid. According to the programming method of the present invention, first, a parallel-programming process is performed for valid blocks of all of the flash memories. Then, a serial-programming process is performed for flash memories having invalid blocks. This enables the time required for programming flash memories with one or more invalid blocks to be reduced.

8 Claims, 7 Drawing Sheets

Fig. 3
(Prior Art)

| BLK 1 |
|---|
| BLK 2 |
| BLK 3 |
| BLK 4 |
| BLK 5 |
| BLK 6 |
| BLK 7 |
| BLK 8 |
| BLK 9 |
| ⋮ |
| BLKm |
| BLKm+1 |
| BLKm+2 |
| BLKm+3 |
| ⋮ |
| BLKn |

METHOD FOR SIMULTANEOUSLY PROGRAMMING PLURAL FLASH MEMORIES HAVING INVALID BLOCKS

FIELD OF THE INVENTION

The present invention relates to a method for programming an integrated circuit memory device, and more particularly to a method for performing parallel programming for a plurality of flash memories each of which has at least one invalid block.

BACKGROUND OF THE INVENTION

As is well known to those skilled in the art, a flash memory contains a memory cell array which is divided into multiple blocks (or referred to as "a sector") each of which comprises plural memory cells. In such a flash memory, an erasing operation is performed on a block-by-block basis.

The flash memory may contain up to, for example, 20 invalid blocks. The invalid blocks are defined as blocks that contain one or more invalid bits (or memory cells). The flash memories with one or more invalid blocks have the same quality level and AC and DC characteristics as a flash memory with all valid blocks. The invalid blocks do not affect the performance of valid blocks, because the invalid blocks are isolated from the bit line and the common source line (CSL) by a select transistor.

All blocks of the flash memory are erased (e.g. written to hexadecimal value ffh) prior to shipping. However, a flash memory with one or more invalid blocks will be programmed with complementary data, e.g. 00h (hereinafter referred to as "block status information") within the first page, the second page, or all pages of the one or more invalid blocks. These pages may or may not contain the invalid memory cells. The block status information identifies a block containing invalid memory cells so that the block may be avoided when the flash memory is programmed.

Referring to FIG. 1, there is a block diagram showing the structure of a PROM writer system 10 and the flow of signals between the system and plural flash memories 60. An example of the PROM writer system is described in U.S. Pat. No. 4,783,737, entitled PROM WRITER ADAPTED TO ACCEPT NEW WRITING ALGORITHM, the disclosure of which is hereby incorporated by reference. The '737 patent discloses a PROM writer system capable of writing data in a PROM via a writing algorithm stored in a memory that is different from the system program memory (so that the algorithm may be changed without change to the system program itself).

The system 10 (hereinafter referred to as "a PROM writer") is composed of a control unit 20, e.g. a central processing unit (CPU); a ROM unit 30 for storing a system program and a programming algorithm; a RAM unit 40 for storing data to be programmed in the flash memories 60a to 60d; and an interface unit 50. The control unit 20 reads the system program and the programming algorithm stored in the ROM unit 30 and writes the data stored in the RAM unit 40 to the flash memories 60a to 60d via the interface unit 50. The data bus for transmitting the data D0 to Di is shared by the flash memories 60a to 60d. Similarly, the address bus for transmitting the address signals A0 to Ai is shared by the flash memories 60a to 60d.

As shown in FIG. 1, a read enable signal $\overline{RE}$ and a write enable signal $\overline{WE}$ from the PROM writer 10 writer are driven in common to the four flash memories 60a to 60d, but the flash memories 60a, 60b, 60c and 60d are selected independently from each other when corresponding chip select signals $\overline{CS0}$, $\overline{CS1}$, $\overline{CS2}$ and $\overline{CS3}$ are activated, respectively.

FIG. 2 is a prior art flow chart showing the process of writing the same data in each of the plural flash memories 60a to 60d, under the control of the PROM writer 10 illustrated in FIG. 1. FIG. 3 shows a memory map of each flash memory illustrated in FIG. 1. In FIG. 3, the data stored in the RAM unit 40 may be written in remaining blocks BLK3 to BLKn (n: an integer) except for first and second blocks BLK1 and BLK2 of each flash memory 60a to 60d.

The programming process according to the prior art will be expressed below with reference to the accompanying drawings, with particular reference to FIG. 2.

At step S 11, a first flash memory 60a is selected by setting a variable DEVICE to '1'. That is, a first chip select signal $\overline{CS0}$ from the PROM writer 10 becomes low (active). At step S12, one block BLK3 of multiple blocks BLK3 to BLKn of the selected flash memory 60a is selected by setting a variable BLOCK to '3'. Successively, in order to check whether the selected block BLK3 of the selected flash memory 60a is valid, block status information is read out from the selected block BLK3 of the selected flash memory 60a (step S13).

When the selected block BLK3 is determined to be a valid block by means of the control unit 20 of the PROM writer 10, the read block status information corresponding to the selected block BLK3 of the selected flash memory 60a is stored in the PROM writer 10, for example, in the RAM unit 40 of the PROM writer 10 (step S14) And then, the data stored in the RAM unit 40 is programmed in the selected block BLK3 of the selected flash memory 60a through the interface unit 50. When the selected block BLK3 is determined to be an invalid block by means of the control unit 20, the process proceeds to step S16 without programming for the selected block BLK3 after storing the block status information of the selected block BLK3. In other words, the programming operation for the selected block BLK3 is skipped.

At step S16, the control unit 20 of the PROM writer 10 checks whether the selected block BLK3 is a last block to be programmed. If the selected block BLK3 is not a last block, the process proceeds to step S18, in which the variable BLOCK is increased by one so as to assign a next block. The process from step S13 to step SI 8 is repeated until a selected block is determined as a last block to be programmed.

When a selected block is discriminated as a last block, file allocation table (FAT) data in accordance with the block status information, which has been stored temporarily in the RAM unit 40, is programmed in the first or second block BLK1 or BLK2 of the selected flash memory 60a (step S19).

The term "file allocation table" may also be referred to as a "flash file system". A suitable flash file system is more fully described in U.S. Pat. No. 5,404,485, entitled FLASH FILE SYSTEM, the disclosure of which is hereby incorporated by reference.

The process from step S12 to step S18 is repeated until the remaining flash memories 60b to 60d are programmed with the same data as stored in the RAM unit 40, via the process of steps S20 and S21.

When the programming process is finished, the contents of each of the flash memories 60a to 60d is illustrated by the memory map of FIG. 4. As seen in FIG. 4, the data to be programmed in an invalid block is stored instead in a next valid block, as indicated by curved arrows.

As set forth above, the flash memories 60a to 60d which may have one or more invalid blocks are programmed by means of a serial programming process, thereby increasing the time required for the programming process, according to the prior art.

SUMMARY OF THE INVENTION

It is therefore an object of the present invention to provide a method for simultaneously programming plural flash memories which have at least one invalid block, thereby reducing the programming time on average.

In order to attain the above objects, according to an aspect of the present invention, there is provided a method for programming plural flash memories having one or more invalid blocks. Each of the flash memories has a memory cell array which is divided into plural blocks of memory cells. Each of the blocks stores their block status information indicating whether it is valid. The programming for the flash memories according to the present invention is performed under the control of a system, which comprises a control unit, a ROM unit for storing a system program and a program algorithm, a RAM unit for storing program data to be written in the flash memories and an interface unit.

In the programming algorithm according to the present invention, first, the block status information is read out from each memory device, and then is stored in the RAM unit. The plural blocks of each memory device are divided into first, second and third storage regions in accordance with the stored block status information. Blocks of the second storage regions of the respective memory devices are selected by the system. After selecting memory devices having the selected blocks which are valid, the selected valid blocks of the selected memory devices simultaneously are programmed. If the selected blocks are not the last blocks of the respective second storage regions, a next location of each memory device is designated by the system. The above-described process continues until the selected blocks are determined to be the last blocks of the respective second storage regions.

The process for programming flash memories having one or more invalid blocks comprises selecting one of the memory devices with at least one invalid block; programming at least one block of the third storage region of the selected memory device instead of the at least one invalid block thereof; programming the stored block status information of the selected memory device in the first storage region of the selected memory device; selecting a next memory device when the selected device is not the last device to be programmed; and continuing to perform the above-described programming process until the selected device is determined to be a last memory device to be programmed.

According to the programming method of the present invention, first, a parallel-programming process is performed for valid blocks of all of the flash memories. Then, a serial-programming process is performed for flash memories with invalid blocks. As compared with the prior art which uses only a serial-programming process, the time required for programming flash memories with one or more invalid blocks can be reduced by use of the programming algorithm of the present invention.

BRIEF DESCRIPTION OF THE DRAWINGS

The present invention will be described by way of exemplary embodiments, but not limitations, illustrated in the accompanying drawings in which like references denote similar elements, and in which:

FIG. 3 shows a memory map of each flash memory illustrated in FIG. 1;

DESCRIPTION OF THE PREFERRED EMBODIMENT

Figure 1:
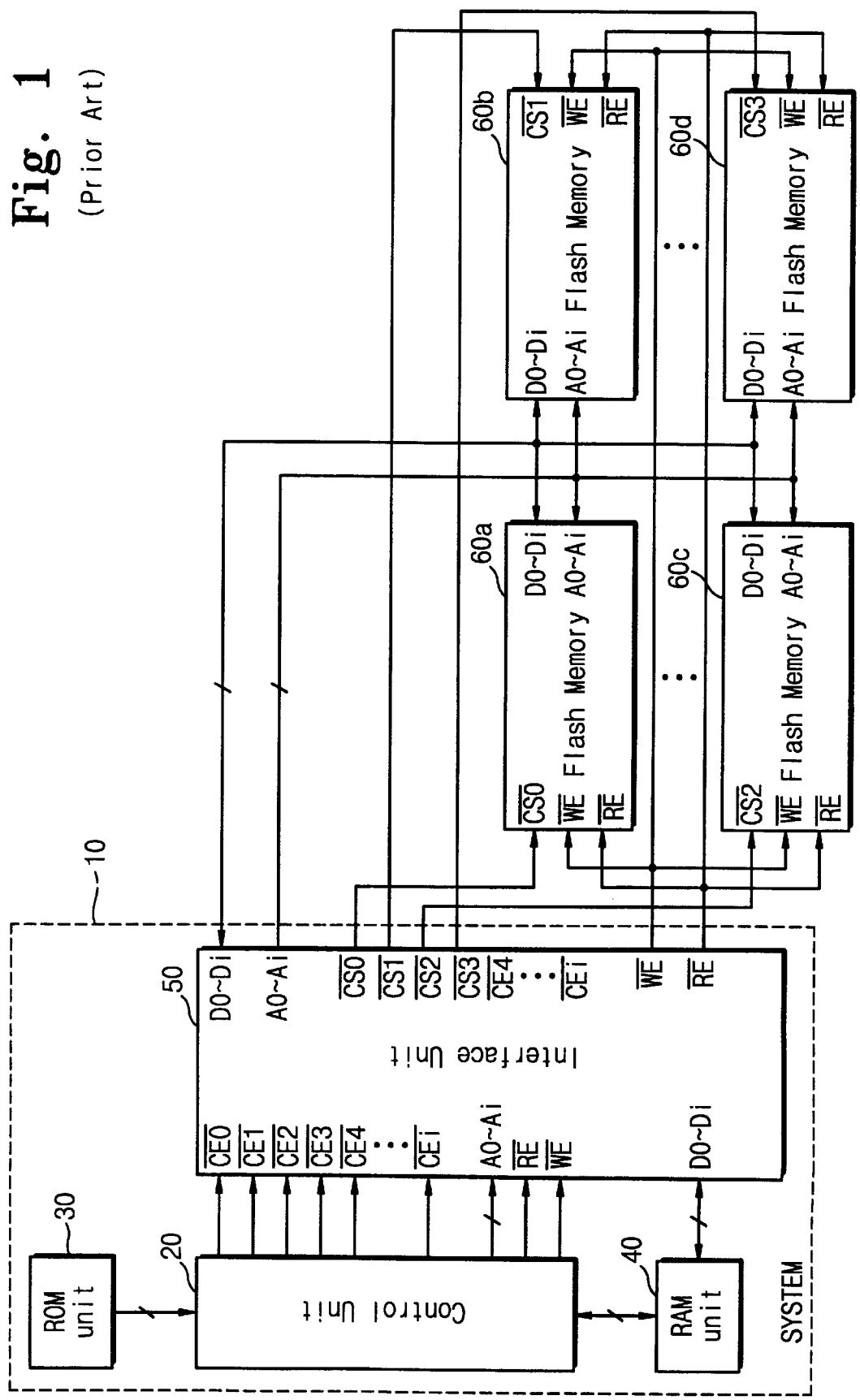
FIG. 1 is a block diagram showing the structure of a conventional PROM writer system and the flow of signals between the system and flash memories to be programmed.
Figure 2:
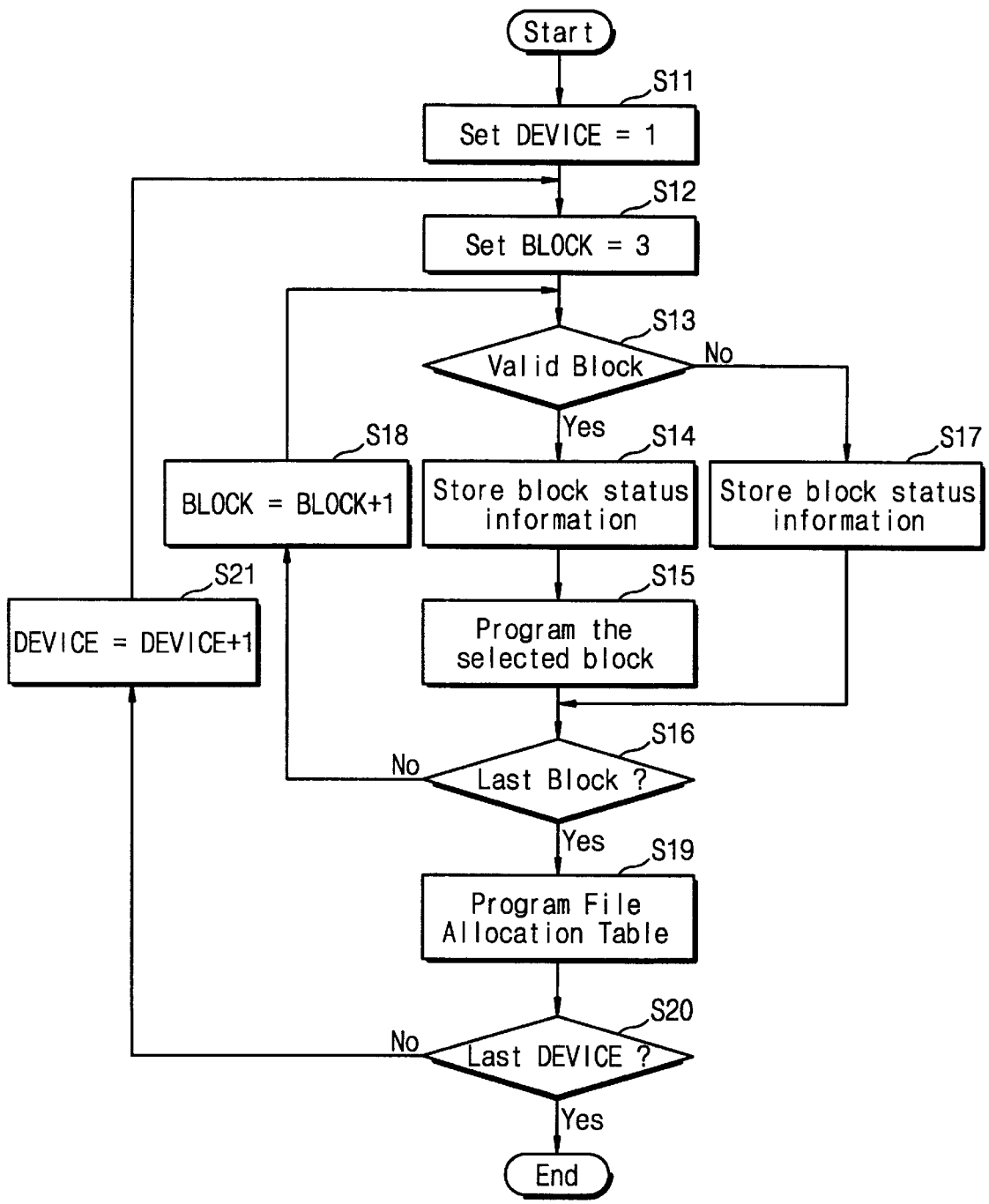
FIG. 2 is a prior art flow chart showing the process of writing the same data in each of plural flash memories under the control of a system illustrated in FIG. 1.
Figure 4:
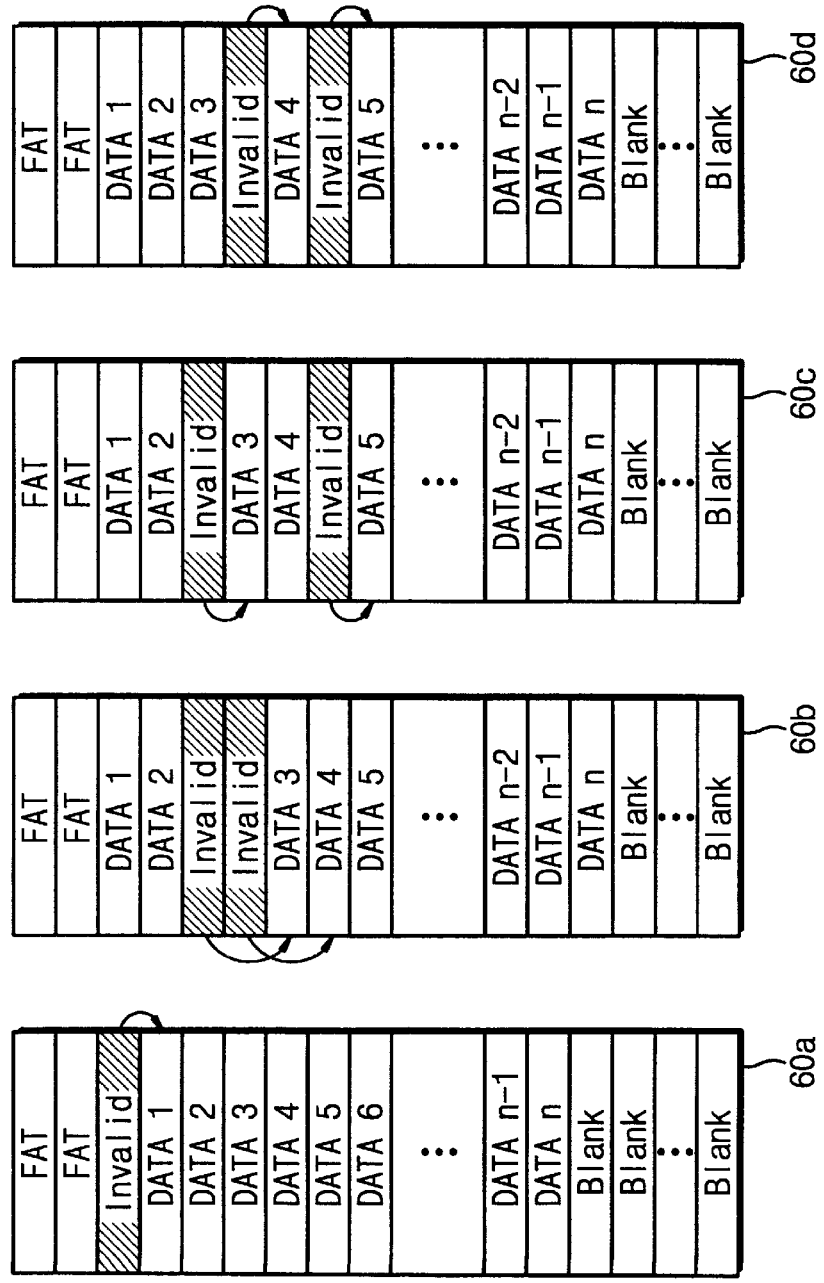
FIG. 4 shows a memory map for each of flash memories when the prior art programming process is finished.

A preferred embodiment of the present invention will be more fully described below with reference to the accompanying drawings. A programming process of the present invention will be performed under the control of a system 10, e.g. a PROM writer system such as is illustrated in FIG. 1. In order to avoid repetition, further description of system 10 is omitted. Importantly, however, in the ROM unit 30 of the system 10, there is stored a programming algorithm according to the present invention instead of the programming algorithm according to the prior art.

Similarly to the prior art set forth in FIG. 1, the data bus for transmitting the data D0 to Di is shared by the flash memories 60a, 60b, 60c and 60d, and the address bus for transmitting the address signals A0 to Ai is shared by the flash memories 60a–60d. Furthermore, a read enable signal $\overline{RE}$ and a write enable signal $\overline{WE}$ from the system 10 of FIG. 1 are collectively provided into the flash memories 60a, 60b, 60c and 60d. The flash memories 60a to 60d are selected independently from each other when corresponding chip select signals $\overline{CS0}$, $\overline{CS1}$, $\overline{CS2}$ and $\overline{CS3}$ are activated, respectively. They are simultaneously selected when corresponding chip select signals $\overline{CS0}$, $\overline{CS1}$, $\overline{CS2}$ and $\overline{CS3}$ are contemporaneously activated.

Figure 5A:
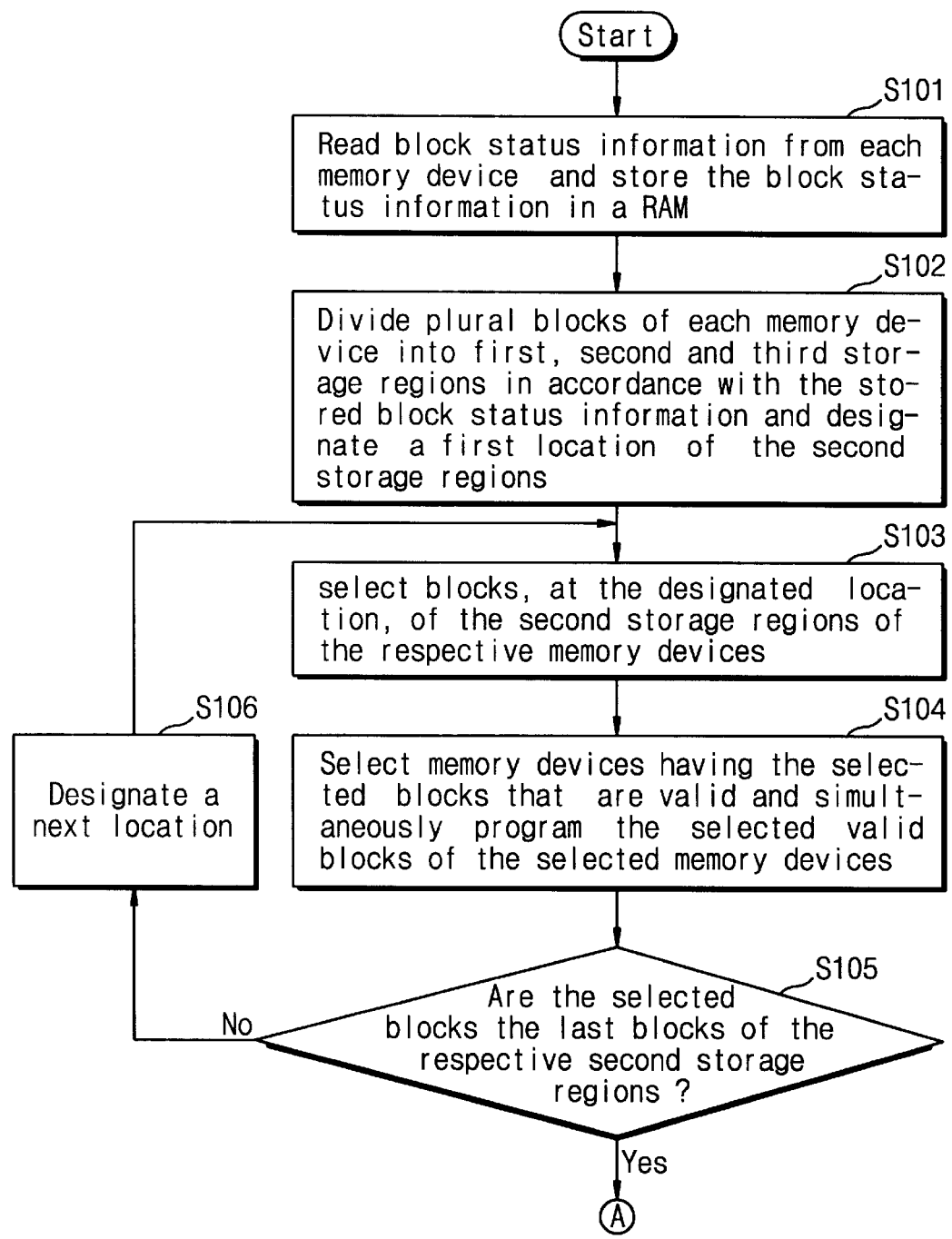
FIG. 5 including sections 5A and 5A, is a flow chart showing a programming algorithm according to the present invention.
Figure 5B:
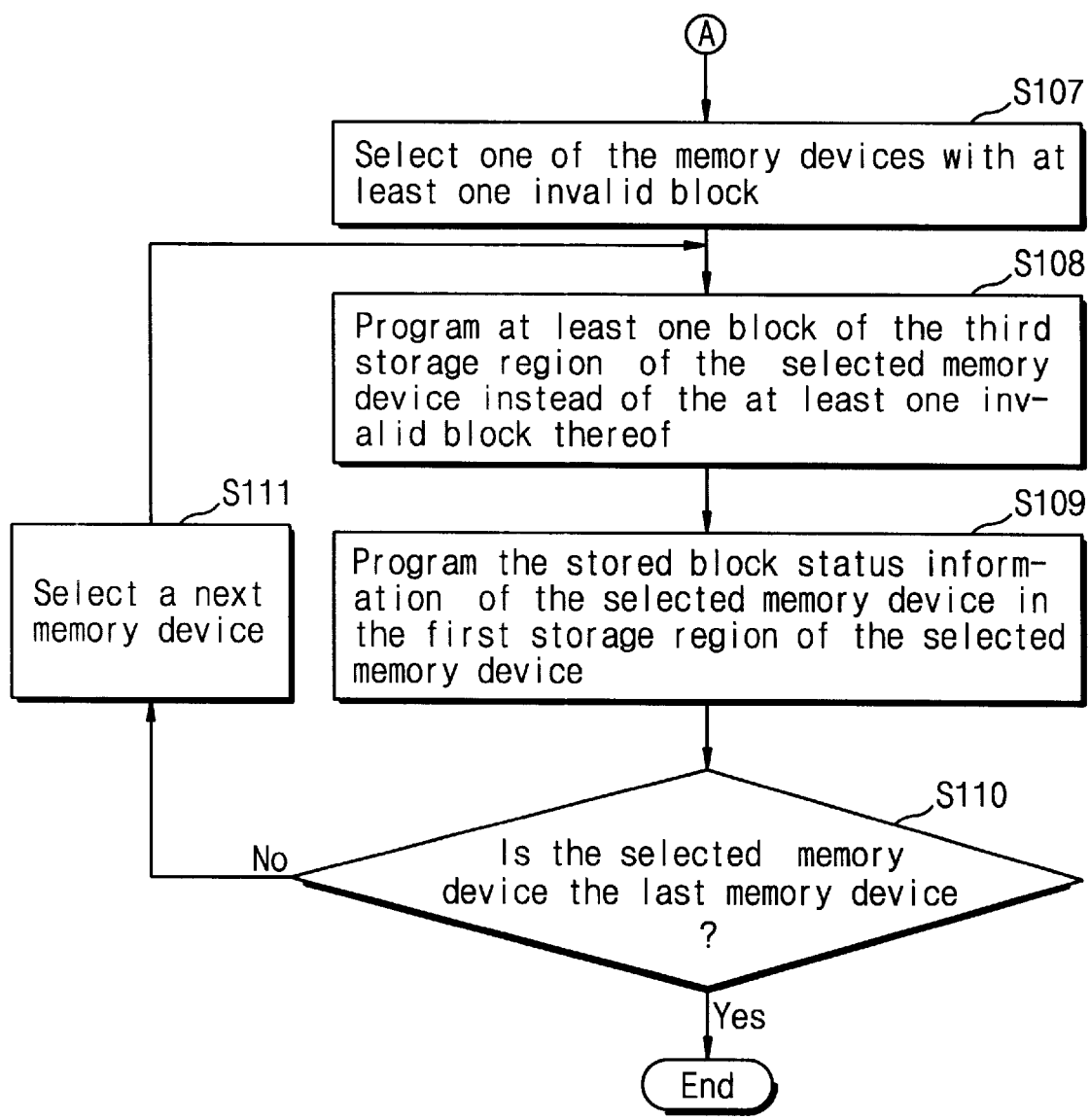

A flow chart showing a programming algorithm of the present invention is illustrated in FIG. 5, which in turn comprises FIGS. 5A and 5B. Hereinafter, the programming process of the present invention will be more fully described with reference to FIGS. 1, 5 and 6.

Referring to FIG. 5A, it may be seen that at step S101, block status information is read out from all blocks BLK0 to BLKn of each flash memory 60a to 60d, and the block status information is stored in the RAM unit 40 of the system 10.

At step S102, all of the blocks BLK0 to BLKn of each flash memory 60a to 60d are divided into three storage regions in accordance with the block status information stored in the RAM unit 40. In particular, a first storage region is designated as a portion for storing file allocation table (FAT) information, a second storage region as a portion for storing data information to be written in the flash memories 60a to 60d (e.g. an application program), and a third storage region as the remaining portion. A first location of each second storage region is designated (step S102).

Figure 6:
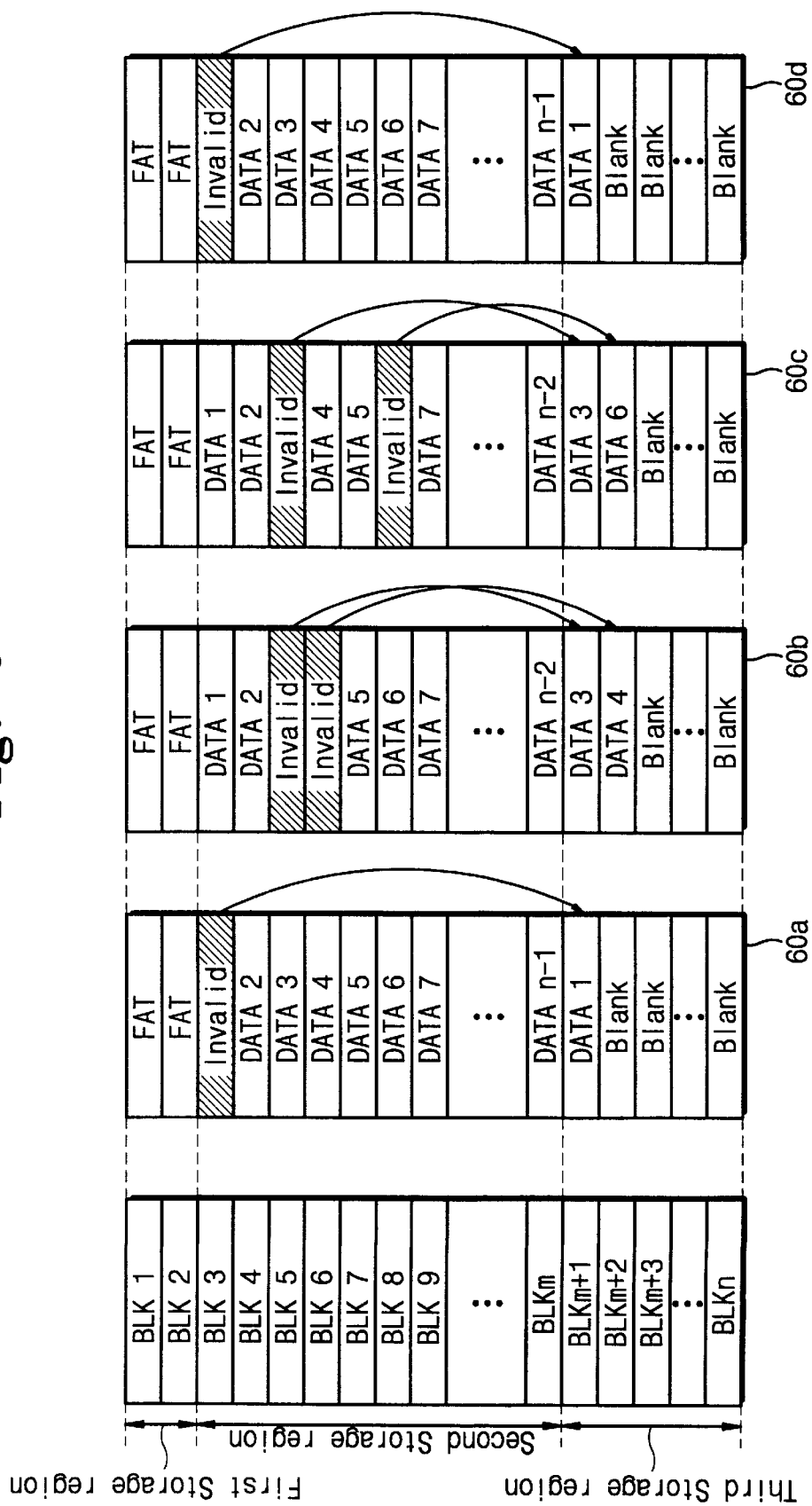
FIG. 6 is a memory map for each of flash memories when the programming process of the present invention is finished.

For example, first and second blocks BLK1 and BLK2 of each flash memory 60a to 60d are set to the first storage region, third to mth blocks BLK3 to BLKm of each flash memory 60a to 60d are set to the second storage region, and remaining blocks BLK(m+1) to BLKn (m<n) of each flash memory 60a to 60d are set to the third storage region, as illustrated in FIG. 6 to be more fully explained below. As a result, under the condition where the flash memories 60a to 60d have the same memory capacity, the first, second and third storage regions of the respective flash memories 60a to 60d are divided so as to have the same number of blocks. It is appreciated by ones skilled in the art that flash memories having different capacity from each other nevertheless may be programmed in accordance with the invention.

And then, to be designated at step S102, blocks of the second storage regions of the respective memory devices 60a, 60b, 60c and 60d are selected by sequentially activating chip select signals $\overline{CS0}$, $\overline{CS1}$, $\overline{CS2}$ and $\overline{CS3}$ from the system 10 (step S103). The control unit 20 of the system 10 checks to see whether the selected blocks BLK3 of the flash memories 60a to 60d are valid, depending on the stored block status information in the RAM unit 40 (step S104).

For example, if the selected block BLK3 of the first flash memory 60a is valid, the first flash memory 60a is determined as a device to be programmed. Otherwise, the first flash memory 60a is designated as a device not to be programmed. The process continues to be performed until it is checked whether the selected blocks BLK3 of remaining flash memories 60b to 60d are valid.

After selecting flash memories designated as the device to be programmed at step S104, i.e. flash memories having valid selected blocks BLK3, the selected valid blocks of the selected flash memories are simultaneously programmed at step S104. For example, at step S104, chip select signals CS1 and CS2 may be activated which correspond to the flash memories 60b and 60c having the selected valid blocks BLK3. Meanwhile, for example, chip select signals $\overline{CS0}$ and $\overline{CS3}$ corresponding to the flash memories 60a and 60d having invalid blocks BLK3 are inactivated. As a result, the data stored in the RAM unit 40 is simultaneously programmed in the selected blocks BLK3 of only the second and third flash memories 60b and 60c under the control of the system 10 in what is referred to herein as a parallel-programming fashion. The invalid blocks BLK3 of the first and fourth flash memories 60a and 60d are prevented from being programmed in accordance with this example via inactivation of their corresponding chip select signals $\overline{CS0}$ and $\overline{CS3}$.

At step S105, PROM writer system 10 checks whether the selected blocks are the last blocks of the respective second storage regions. So long as the selected blocks are not the last blocks, the process proceeds to step S106, in which a next location will be designated. The process from step S103 to step S106 is repeated until selected blocks are determined to be the last blocks of the respective second storage regions. FIG. 6 illustrates a memory map of the contents of the flash memories 60a to 60d when the programming process for valid blocks is finished, (see first and second storage regions, so designated).

As seen in FIG. 6, although blocks BLK3 of the second storage regions in the first and fourth flash memories 60a and 60d are invalid blocks, nevertheless valid blocks BLK3 of the second and third flash memories 60b and 60c are programmed with data DATA1 at the same time (the parallel-programming). In contrast, no data is written in the invalid blocks BLK3 corresponding to the first and fourth flash memories 60a and 60d. Similarly, although blocks BLK5 of the second storage regions in the second and third flash memories 60b and 60c are invalid blocks, nevertheless valid blocks BLK5 corresponding to the first and fourth flash memories 60a and 60d are programmed simultaneously with data DATA3. And, no data is written in invalid blocks BLK5 corresponding to the second and third flash memories 60b and 60c. In the case where the blocks BLK4 of the first to fourth flash memories 60a to 60d are invalid blocks, the blocks BLK4 of the flash memories 60a to 60d are nevertheless simultaneously programmed with the same data DATA2.

The process of programming invalid block(s) of each of the flash memories 60a to 60d will be more fully described below with reference to section FIG. 5B of FIG. 5.

At step S107, the system 10 selects one of the flash memories 60a to 60d with one or more invalid blocks, depending on the block status information stored in the RAM unit 40. Data to be written in the one or more invalid blocks is programmed in blocks of the third storage region of the selected flash memory (step S108). For example, returning to FIG. 6, the data DATAL to be written in the invalid block BLK3 of the first flash memory 60a is programmed in (m+1)th block BLK(m+1) of the first flash memory 60a.

At step S109, the stored block status information data in the RAM unit 40 is programmed as file allocation table (FAT) data in the first storage region of the selected flash memory (the first flash memory 60a).

At step S110, the system 10 checks whether the selected flash memory is a last flash memory device, having invalid blocks, to be programmed. So long as the selected flash memory is not a last flash memory, the process proceeds to step S111, in which a next flash memory will be selected. The process from step S108 to step S111 continues to be performed until all the flash memories 60a to 60d having one or more invalid blocks have been selected and programmed. In accordance with the immediately above-described serial-programming process, the data corresponding to invalid block(s) of other flash memories 60b, 60c and 60d will be programmed in blocks of corresponding flash memories 60b to 60d as shown in FIG. 6.

According to the embodiment of the present invention, first, the programming for valid blocks of all the flash memories 60a to 60d is performed in parallel. The time required for the above-described parallel-programming process for the plural flash memories is less than or equal to that required for the process of programming only one flash memory. And then, flash memories 60a to 60d with one or more invalid blocks are selected and programmed in sequence. As a result, the time required for programming the plural flash memories with one or more invalid blocks can be significantly reduced by the amount of time saved in programming the more typically valid blocks in parallel while using sequential programming for the less typical invalid blocks. On average, then, flash memory programming time is reduced.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for programming a plurality of electrically programmable nonvolatile memory devices each having a memory cell array divided into plural blocks of memory cells, wherein each of the blocks stores block status information indicating whether it is valid or not, the method comprising the steps of:

(a) reading the block status information from each memory device and storing the block status information in a data storage unit;

(b) dividing the plural blocks of each memory device into first, second and third storage regions in accordance with the stored block status information and designating a first location of each second storage region;

(c) selecting blocks, at the designated location, of the second storage regions of the respective memory devices;

(d) after selecting memory devices having the selected blocks which are valid, simultaneously programming the selected valid blocks of the selected memory devices;

(e) designating a next location of each memory device when the selected blocks are not the last blocks of the respective second storage regions; and (f) performing the steps (c) through (e) repeatedly until the selected blocks are determined to be the last blocks of the respective second storage regions.

2. The method according to claim 1, further comprising the steps of:

(g) selecting one of the memory devices with at least one invalid block;

(h) programming at least one block of the third storage region of the selected memory device instead of the at least one invalid block thereof;

(i) programming the stored block status information of the selected memory device in the first storage region of the selected memory device;

(j) selecting a next memory device when the selected device is not last; and (k) performing the steps (h) through (j) until the selected device is determined to be a last memory device.

3. The method according to claim 1, wherein the data storage unit is a random access memory installed in a system for controlling the programming for plural memory devices.

4. A method for programming electrically programmable nonvolatile memory devices sharing data and address buses, under the control of a system which comprises a central processing unit, an interface unit, a RAM unit, and a ROM unit, wherein each memory device has a memory cell array divided into plural blocks of memory cells, and wherein each of the blocks stores block status information indicating whether it is valid or not, the method comprising the steps of:

(a) reading the block status information from each memory device and storing the block status information in the RAM unit;

(b) dividing the plural blocks of each memory device into first, second and third storage regions in accordance with the stored block status information and designating a first location of each memory device;

(c) selecting blocks, at the designated location, of the second storage regions of the respective memory devices;

(d) after selecting memory devices having the selected blocks which are valid, simultaneously programming the selected valid blocks of the selected memory devices;

(e) checking whether the selected blocks are the last blocks of the respective second storage regions;

(f) designating a next location of each memory device when the selected blocks are not last;

(g) performing the steps (c) through (f) repeatedly until the selected blocks are determined to be the last blocks of the respective second storage regions; and (h) sequentially programming the memory devices having one or more invalid blocks.

5. The method according to claim 4, whererin the step (h) comprises the steps of:

(i) selecting one of the memory devices with at least one invalid block;

(j) programming at least one block of the third storage region of the selected memory device instead of the at least one invalid block thereof;

(k) programming the stored block status information, as the file allocation table data, of the selected memory device in the first storage region of the selected memory device;

(l) selecting a next memory device when the selected device is not last; and (m) performing the steps (j) through (l) until the selected device is determined to be a last memory device.

6. A method for programming a plurality of flash memory devices each having a memory cell array divided into plural blocks of memory cells, wherein each of the blocks stores block status information indicating whether it is valid or not, the method comprising the steps of:

(a) reading the block status information from each flash memory device and storing the block status information in a data storage unit;

(b) dividing the plural blocks of each flash memory device into first, second and third storage regions in accordance with the stored block status information and designating a first location of each second storage region;

(c) selecting blocks, at the designated location, of the second storage regions of the respective memory devices;

(d) after selecting memory devices having the selected blocks which are valid, simultaneously programming the selected valid blocks of the selected memory devices; and (e) checking whether the selected blocks are the last blocks of the respective second storage regions;

(f) designating a next location of each memory device when the selected blocks are not last;

(g) performing the steps (c) through (f) repeatedly until the selected blocks are determined to be the last blocks of the respective second storage regions;

(h) selecting one of the memory devices with at least one invalid block;

(i) programming at least one block of the third storage region of the selected memory device instead of the at least one invalid block thereof;

(j) programming the stored block status information of the selected memory device in the first storage region of the selected memory device;

(k) checking whether the selected device is the last device to be programmed;

(l) selecting a next memory device so long as the selected device is not the last device to be programmed; and (m) performing the steps (i) through (l) until the selected device is determined to be the last memory device to be programmed.

7. The method according to claim 6, wherein the memory devices share common data and address buses.

8. The method according to claim 6, wherein the method for programming the flash memory devices is performed under the control of a system which comprises a central processing unit, a RAM unit, a ROM unit and an interface unit, wherein the block status information is stored in the RAM unit of the system.

* * * * *

UNITED STATES PATENT AND TRADEMARK OFFICE
CERTIFICATE OF CORRECTION

PATENT NO. : 6,236,593 B1
DATED : May 22, 2001
INVENTOR(S) : Hong et al.

Page 1 of 1

It is certified that error appears in the above-identified patent and that said Letters Patent is hereby corrected as shown below:

Column 2,
Line 44, "SI8" should read -- S18 --.

Column 4,
Line 8, "5A and 5A" should read -- 5A and 5B --.

Column 5,
Line 26, "CS1 and CS2" should read -- $\overline{CS1}$ and $\overline{CS2}$ --.

Column 6,
Line 9, "DATAL" should read -- DATA1 --.

Signed and Sealed this

Seventh Day of May, 2002

Attest:

*Attesting Officer*

JAMES E. ROGAN
*Director of the United States Patent and Trademark Office*